United States Patent
Biraud et al.

(10) Patent No.: US 8,994,392 B2
(45) Date of Patent: Mar. 31, 2015

(54) METHOD OF DETECTING A FAULT WITH THE MEANS FOR DE-ICING A PROBE FOR MEASURING A PHYSICAL PARAMETER

(75) Inventors: Benoit Biraud, Vaux le Penil (FR); Franck Godel, Chartrettes (FR)

(73) Assignee: SNECMA, Paris (FR)

( * ) Notice: Subject to any disclaimer, the term of this patent is extended or adjusted under 35 U.S.C. 154(b) by 196 days.

(21) Appl. No.: 13/805,147

(22) PCT Filed: Jun. 22, 2011

(86) PCT No.: PCT/FR2011/051433
§ 371 (c)(1),
(2), (4) Date: Dec. 18, 2012

(87) PCT Pub. No.: WO2011/161377
PCT Pub. Date: Dec. 29, 2011

(65) Prior Publication Data
US 2013/0088249 A1 Apr. 11, 2013

(30) Foreign Application Priority Data
Jun. 25, 2010 (FR) ..................... 10 55121

(51) Int. Cl.
*G08B 19/02* (2006.01)
*G01R 31/3187* (2006.01)
*G01R 31/28* (2006.01)
*B64D 15/20* (2006.01)
*F01D 17/08* (2006.01)
*G01D 3/08* (2006.01)
*G01K 15/00* (2006.01)

(52) U.S. Cl.
CPC ............ *G01R 31/2829* (2013.01); *B64D 15/20* (2013.01); *F01D 17/08* (2013.01); *G01D 3/08* (2013.01); *G01K 15/00* (2013.01); *G01K 15/007* (2013.01); *F05D 2260/80* (2013.01); *F05D 2260/85* (2013.01)
USPC ................. 324/750.3; 340/581; 244/134 F; 219/497

(58) Field of Classification Search
None
See application file for complete search history.

(56) References Cited

U.S. PATENT DOCUMENTS

| | | | |
|---|---|---|---|
| 4,688,185 A * | 8/1987 | Magenheim et al. | 702/172 |
| 4,750,356 A * | 6/1988 | Sommer | 73/170.14 |
| 5,523,959 A | 6/1996 | Seegmiller | |
| 6,328,467 B1 * | 12/2001 | Keyhani | 374/16 |
| 7,921,632 B2 * | 4/2011 | Jacquet-Francillon et al. | 60/39.093 |

(Continued)

FOREIGN PATENT DOCUMENTS

GB 756 529 9/1956
GB 840 509 7/1960

OTHER PUBLICATIONS

International Search Report Issued Dec. 22, 2011 in PCT/FR11/051433 Filed Jun. 22, 2011.

*Primary Examiner* — Paresh Patel
(74) *Attorney, Agent, or Firm* — Oblon, McClelland, Maier & Neustadt, L.L.P.

(57) ABSTRACT

A method of detecting a fault in a de-icer probe for measuring a physical parameter on an airplane engine, the method including: prior to starting an engine, measuring a first value of the physical parameter with help of the probe; activating the probe de-icer; at an end of a determined duration from a start of de-icing, measuring a second value of the parameter with help of the probe; and comparing the first and second values and generating a fault signal if the difference between the first and second values is less than a determined threshold.

5 Claims, 1 Drawing Sheet

(56) References Cited

U.S. PATENT DOCUMENTS 7,922,120 B2 * 4/2011 Kumar et al. ............ 244/134 D
8,037,750 B2 * 10/2011 Heuer et al. ............... 73/170.26
8,517,601 B2 * 8/2013 Stothers et al. ................. 374/16

* cited by examiner

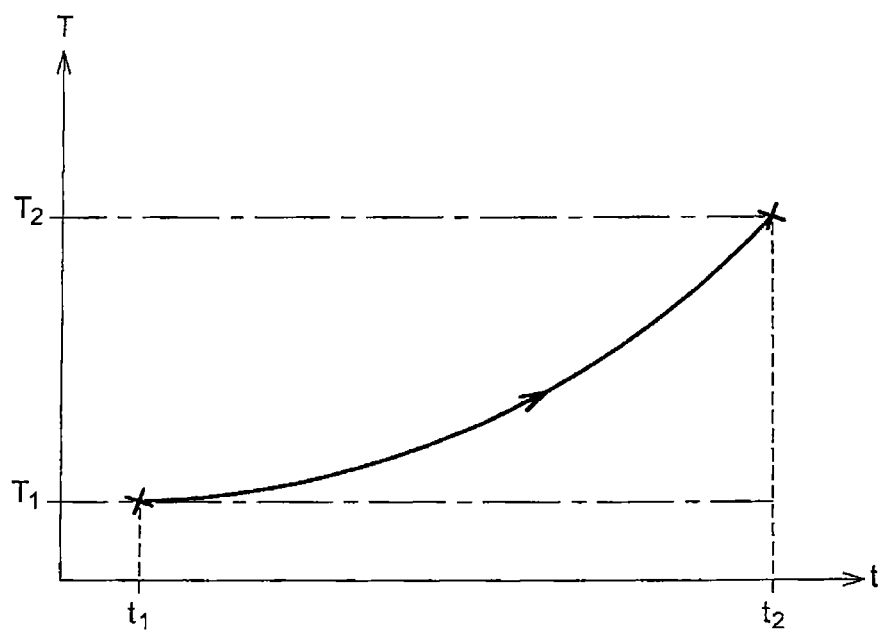

METHOD OF DETECTING A FAULT WITH THE MEANS FOR DE-ICING A PROBE FOR MEASURING A PHYSICAL PARAMETER

BACKGROUND OF THE INVENTION

1. Field of the Invention

The present invention relates to a method of detecting a fault in de-icer means of a probe for measuring a physical parameter, such as a probe for measuring the temperature of an airplane engine.

2. Discussion of the Background

An airplane engine is fitted with probes that may be subjected to the formation of ice, depending on their locations. Ice formed on a probe falsifies its measurements. By way of example, a temperature measurement is used in particular to adjust the positions of the variable-pitch stator vanes in the compressor of the engine. A measurement error can run the risk of the engine surging, and consequently can lead to a major loss of thrust from the engine or to the engine stopping.

In order to avoid that, de-icer means are provided to melt the ice that forms on the probe, which means comprise a heater resistance arranged inside the body of the probe.

Although the sensing element of the probe that is used for measuring temperature is not directly heated by the resistance, it records an increase in temperature because it is heated by convection. The measurement error due to the heating of the probe while the engine is in operation is compensated by software that modifies the measured temperature value by several degrees.

Nevertheless, the prior art does not guarantee real effectiveness and proper operation of de-icer means, since the prior art does not make it possible to detect a fault in the de-icer means of the probe.

SUMMARY OF THE INVENTION

A particular object of the invention is to provide a solution to that problem that is simple, effective, and inexpensive.

To this end, the invention provides a method of detecting a fault in de-icer means of a probe for measuring a physical parameter on an airplane engine, the method comprising the successive steps consisting in:
  while on the ground, prior to starting the engine, measuring a first value of the physical parameter with the help of the probe;
  activating the probe de-icer means;
  at the end of a determined duration from the start of de-icing, measuring a second value of the parameter with the help of the probe; and
  comparing these two values and generating a fault signal if the difference between the two values is less than a determined threshold.

If the difference between the two values is greater than the threshold, it is possible to guarantee that the de-icer means are operating properly. Conversely, if the difference is less than the threshold, it is necessary to warn an operator of the fault in the de-icer means.

According to a characteristic of the invention, the parameter measured with the help of the probe is temperature.

Under such circumstances, the threshold value may for example lie in the range 4 kelvins (K) to 8 K, and is preferably about 5 K.

In a variant, the parameter measured with the help of the probe is pressure.

The above-mentioned steps are performed before starting the engine in order to avoid the measurement of the parameter by the probe being modified by the stream of air passing through the engine.

According to another characteristic of the invention, the second value of the parameter is measured with the help of the probe after a duration lying in the range 10 seconds to 1 minute from the start of de-icing, e.g. equal to about 20 seconds.

BRIEF DESCRIPTION OF THE DRAWINGS

The invention can be better understood and other details, characteristics, and advantages of the invention appear on reading the following description made by way of non-limiting example and with reference to the accompanying drawing in which the sole FIGURE is a diagram showing how the temperature measured by the probe varies as a function of time during de-icing.

DETAILED DESCRIPTION OF THE PREFERRED EMBODIMENTS

The sole FIGURE shows the normal operation of a temperature sensor of an airplane engine, in particular a probe associated with the low-pressure compressor of the engine. As is known, the body of the probe is fitted with de-icer means comprising a heater resistance suitable for melting ice that accumulates on the body of the probe, with the engine also being fitted with a computer including as one of its functions, a function that is described in detail below with reference to the sole FIGURE.

The invention proposes a test for verifying the effectiveness and the proper operation of the above-mentioned de-icer means before starting the engine, during which test a first temperature value $T_1$ is measured at an instant $t_1$, then the de-icer means are activated in order to heat the body of the probe by convection. During this step, in normal operation, the temperature T measured by the probe increases, as shown by the curve in the sole FIGURE.

At the end of a duration $(t_2-t_1)$ lying in the range 10 seconds to 1 minute, and preferably equal to about 20 seconds, starting from the beginning of de-icing, a second temperature value $T_2$ is measured using the probe.

If the difference between the two temperature values $T_1$ and $T_2$ is greater than a threshold value lying in the range 4 K to 8 K, and preferably equal to about 5 K, then the computer deduces that the de-icer means are operating correctly. Otherwise, if the temperature difference is less than the threshold value, the computer deduces that the de-icer means are faulty and therefore delivers a corresponding fault signal in order to warn an operator.

The invention is equally applicable to a pressure probe, in particular one mounted on an airplane engine.

The invention claimed is:

1. A method of detecting a fault in a de-icer means of a probe for measuring a physical parameter on an airplane engine, the method comprising:
  prior to starting an engine, measuring a first value of the physical parameter with help of the probe;
  activating the probe de-icer means;
  at an end of a determined duration from a start of de-icing, measuring a second value of the parameter with help of the probe; and
  comparing the first and second values and generating a fault signal if the difference between the first and second values is less than a determined threshold.

2. A method according to claim 1, wherein the parameter measured with help of the probe is temperature.

3. A method according to claim 1, wherein the parameter measured with help of the probe is pressure.

4. A method according to claim 1, wherein the second value of the parameter is measured with help of the probe after a duration lying in a range of 10 seconds to 1 minute from the start of de-icing.

5. A method according to claim 1, wherein the second value of the parameter is measured with help of the probe after a duration equal to about 20 seconds.

\* \* \* \* \*